United States Patent
Jung

(10) Patent No.: US 7,064,383 B2
(45) Date of Patent: Jun. 20, 2006

(54) NON-VOLATILE MEMORY DEVICE

(75) Inventor: Jin Hyo Jung, Bucheon (KR)

(73) Assignee: DongbuAnam Semiconductor Inc., Seoul (KR)

(*) Notice: Subject to any disclaimer, the term of this patent is extended or adjusted under 35 U.S.C. 154(b) by 96 days.

(21) Appl. No.: 11/024,744

(22) Filed: Dec. 30, 2004

(65) Prior Publication Data
US 2005/0139902 A1    Jun. 30, 2005

(30) Foreign Application Priority Data
Dec. 31, 2003  (KR) .............. 10-2003-0101715

(51) Int. Cl.
H01L 29/792    (2006.01)
(52) U.S. Cl. .............. 257/324; 257/326; 257/316; 257/319
(58) Field of Classification Search .......... None
See application file for complete search history.

(56) References Cited

U.S. PATENT DOCUMENTS 6,798,688 B1* 9/2004 Joshi .................. 365/154

* cited by examiner

Primary Examiner—Tu-Tu Ho
(74) Attorney, Agent, or Firm—Oblon, Spivak, McClelland, Maier & Neustadt, P.C.

(57) ABSTRACT

A non-volatile memory including a semiconductor substrate, and a SONOS electrode on the semiconductor substrate, where the SONOS electrode has a channel area defined underneath. The memory also includes a first layer in contact with a side of the SONOS electrode, a second layer in contact with another side of the SONOS electrode, a pass electrode in contact with the first layer, a recall electrode in contact with the second layer, and a pair of doped regions in the semiconductor substrate. The pair of doped regions are formed where the SONOS, pass, and recall electrodes are not formed. The memory further includes a pair of extension channels in the semiconductor substrate under the pass and recall electrodes, where the pair of extension channels extend from the doped regions toward the channel area.

7 Claims, 4 Drawing Sheets

NON-VOLATILE MEMORY DEVICE

BACKGROUND OF THE INVENTION

1. Field of the Invention

The present invention relates to a non-volatile memory device.

2. Description of the Related Art

FIG. 1 is a circuit diagram of a non-volatile memory device according to the related art. A non-volatile memory device, e.g., a non-volatile static random access memory (nvSRAM), may include an SRAM latch 50 having transistors 51 and 52, pass gates 40 and 41 reading/writing a high/low state formed in the SRAM latch 50, a silicon-oxide-nitride-oxide-silicon (SONOS) transistor 20 for storing the high/low state of the SRAM latch 50 when the power is turned off, and pass and recall transistors 30 and 10 controlling read, program, and erase operations of the SONOS transistor 20.

FIG. 2 is a cross-sectional view of a non-volatile memory device according to the related art. An impurity diffusion region 13 may be formed between a SONOS electrode 22 of the SONOS transistor 20 and a recall electrode 15 of the recall transistor 10. Another impurity diffusion region 33 may be formed between the SONOS electrode 22 and a pass electrode 35 of the pass transistor 30. Also, impurity diffusion regions 11 and 31 may be formed adjacent to the recall electrode 15 and the pass electrode 35 to be symmetric to the former impurity diffusion regions 13 and 33, respectively.

When reading information stored in the SONOS transistor of the above-configured non-volatile memory device, a high-state voltage is applied to the recall transistor 10, the pass transistor 30, and a Vcc node 101 by a logic circuit while the SONOS transistor 20 is grounded.

In doing so, both the recall and pass transistors 10 and 30 are turned on by the high-state voltage. And, the left SONOS transistor (e.g., in erase mode) 20 and a right SONOS transistor (e.g., in program mode) 21 selectively apply the voltage applied to the Vcc node 101 according to their turn-on or turn-off states. Hence, left and right sides of the SRAM latch 50 are in high and low states according to the operations of the SONOS transistors 20 and 21, respectively. As a result, the logic circuit is facilitated to read the information stored in the SONOS transistors 20 and 21.

Under the above bias condition, most of the voltage applied to the Vcc node 101, as shown in FIG. 2, is transferred to the impurity diffusion region 13 of the SONOS electrode 22. A depletion area 14 then extends toward a channel area CA of the SONOS electrode 22 by the transferred voltage.

In doing so, since the channel area CA of the SONOS electrode 22 is counter-doped to lower its threshold voltage, the depletion area 14 having extended to the channel area of the SONOS electrode 22 may be merged with another depletion area 34 unless a separate management is performed thereon.

If the depletion area 14 merges with another depletion area 34, the SONOS electrode 22 completely loses its control over its channel area CA so that current always flows to the Vcc node 101 to a Vs node 102 regardless of the erase or program mode of the SONOS electrode 22. Consequently, the nvSRAM is unable to normally perform its function.

SUMMARY OF THE INVENTION

Accordingly, the present invention is directed to a non-volatile memory device that substantially obviates one or more problems due to limitations and disadvantages of the related art.

In one embodiment, a non-volatile memory consistent with the present invention comprises a semiconductor substrate, a SONOS electrode on the semiconductor substrate, the SONOS electrode having a channel area defined underneath, a first layer in contact with a side of the SONOS electrode, and a second layer in contact with another side of the SONOS electrode. A pass electrode is in contact with the first layer, a recall electrode is in contact with the second layer, and a pair of doped regions are in the semiconductor substrate, the pair of doped regions being formed where the SONOS, pass, and recall electrodes are not formed. And a pair of extension channels are in the semiconductor substrate under the pass and recall electrodes, where the pair of extension channels are extended from the doped regions toward the channel area.

The thickness of the first layer is preferably between about 50 Å and about 500 Å and the thickness of the second layer is preferably between about 50 Å and about 500 Å. Also, the first and second layers can include at least one insulator.

It is to be understood that both the foregoing general description and the following detailed description of the present invention are exemplary and explanatory and are intended to provide further explanation of the invention as claimed.

BRIEF DESCRIPTION OF THE DRAWINGS

A more complete appreciation of the present invention and many of the attended advantages thereof will be readily obtained as the present invention becomes better understood by reference to the following detailed description when considered in connection with the accompanying drawings, in which like reference characters refer to like parts throughout, wherein.

DETAILED DESCRIPTION OF THE INVENTION

Figure 1:
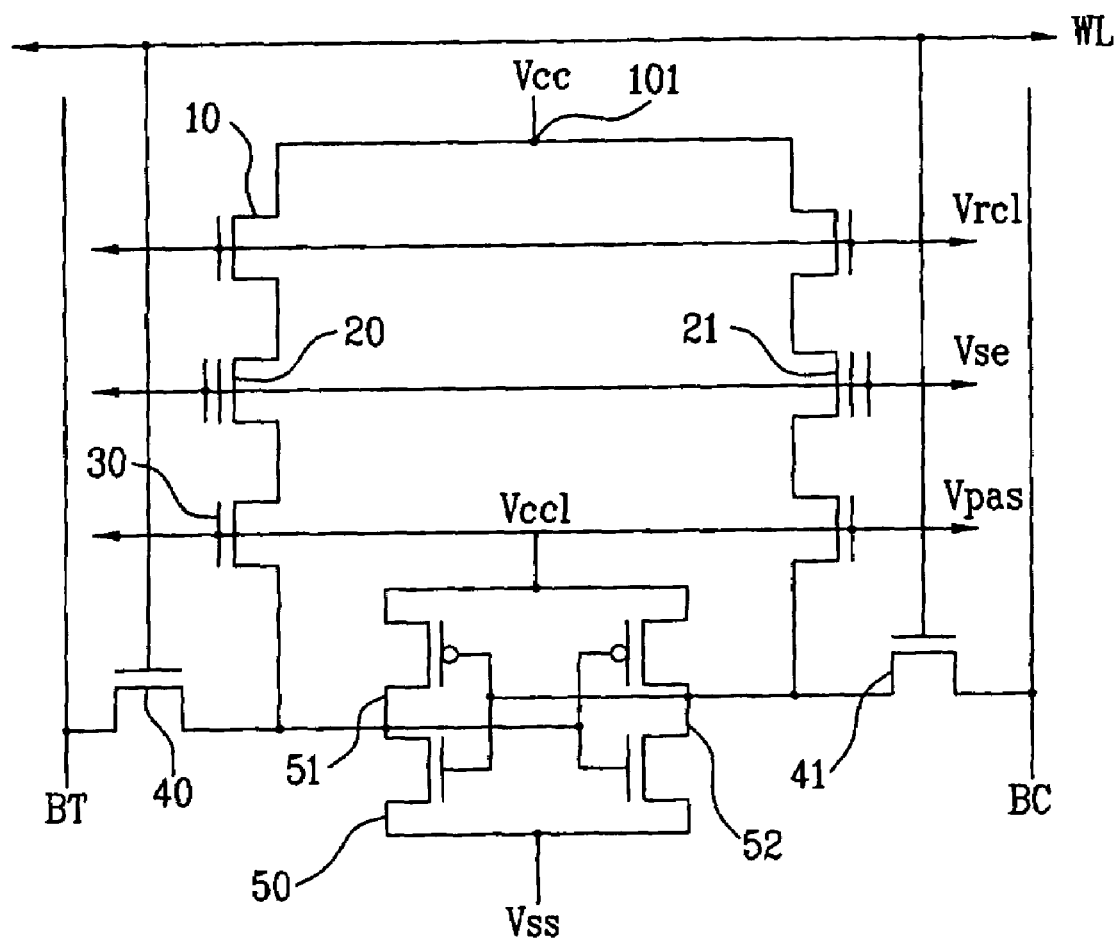
FIG. 1 is a circuit diagram of a non-volatile memory device according to a related art.
Figure 2:
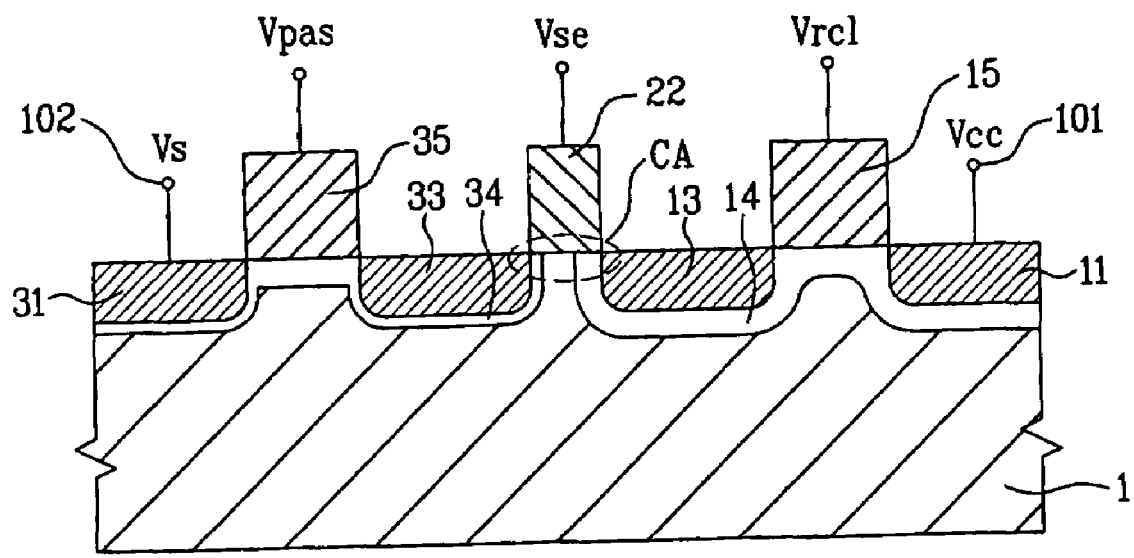
FIG. 2 is a cross-sectional diagram of a non-volatile memory device according to a related art.
Figure 3:
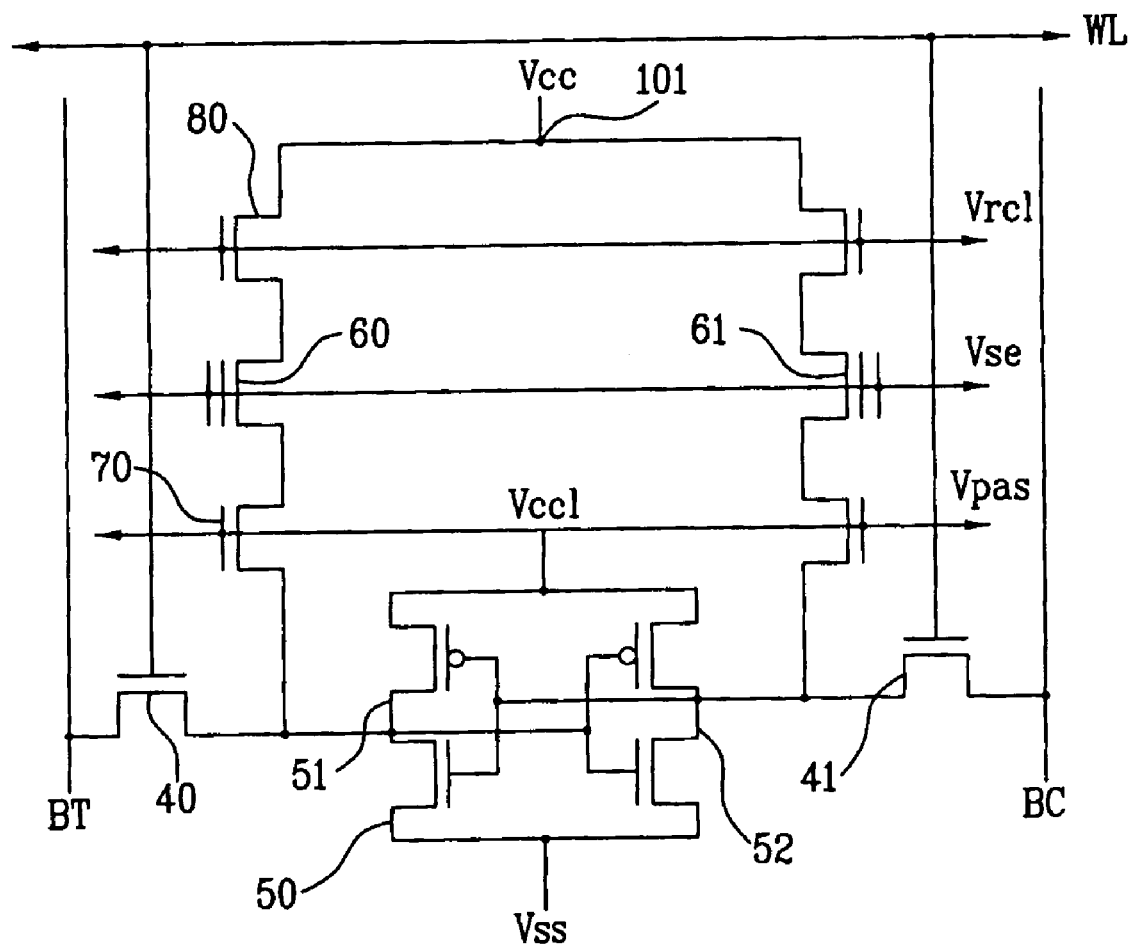
FIG. 3 is a circuit diagram of a non-volatile memory device according to the present invention.

FIG. 3 is a circuit diagram of a non-volatile memory device according to the present invention. A non-volatile memory device, e.g., a non-volatile static random access memory (nvSRAM), may include an SRAM latch 50 having, for example, four transistors 51 and 52, pass gates 40 and 41 reading/writing a high/low state formed in the SRAM latch 50, a silicon-oxide-nitride-oxide-silicon (SONOS) transistor 60 storing the high/low state of the SRAM latch 50 in case of turning off power, and pass and recall transistors 70 and 80 controlling read, program, and erase operations of the SONOS transistor 60.

Figure 4:
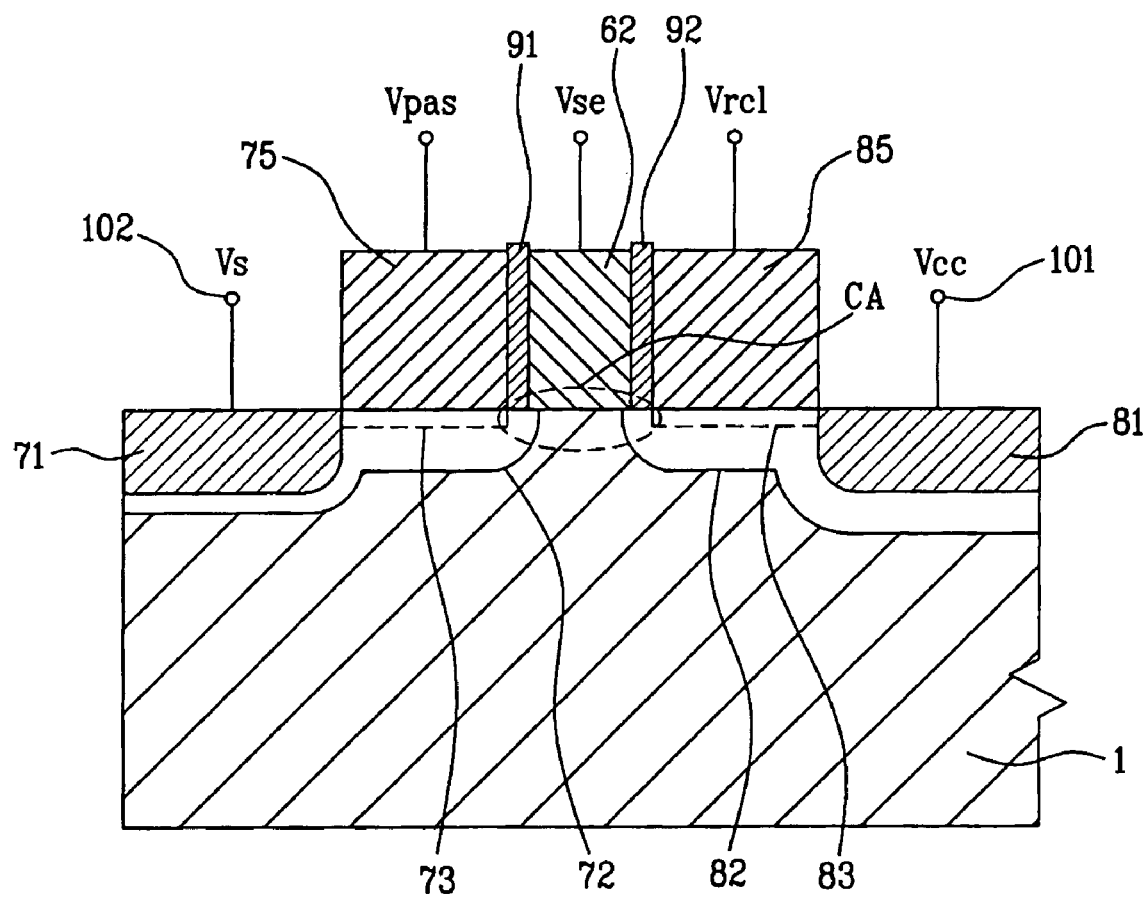
FIG. 4 is a cross-sectional diagram of a non-volatile memory device according to the present invention.

FIG. 4 is a cross-sectional diagram of a non-volatile memory device according to the present invention. A pass electrode 75 of the pass transistor 70 and a recall electrode 85 of the recall transistor 80 may be arranged in the vicinity of both sides of a SONOS electrode 62 of the SONOS transistor 60. A channel area CA may be defined in a substrate 1 under the SONOS electrode 62. Impurity diffusion regions 71 and 81 may be formed in the substrate 1 in the areas where SONOS transistor 60, the pass electrode 75, and recall electrode 85 are not formed. Extension channels 73 and 83 may be defined in the substrate 1 beneath the pass and recall electrodes 75 and 85 to lead extension of the impurity diffusion regions 71 and 81 to the channel area CA, respectively.

Depletion area over-diffusion cut-off inducing layers 91 and 92 may be inserted between the SONOS electrode 62 and pass electrode 75 and between the SONOS electrode 62 and the recall electrodes 85 to cut off over-extension of the depletion areas 72 and 82 attributed to the extension channels 73 and 83, respectively. Each of the depletion area over-diffusion cut-off inducing layers 91 and 92 may have a thickness of, for example, about 50 to about 500 Å. Each of the depletion area over-diffusion cut-off inducing layers 91 and 92 may include at least one insulating material.

When reading information stored in the SONOS transistor 60 of the above-configured non-volatile memory device according to the present invention, a high-state voltage may be applied to the recall transistor 80, the pass transistor 70, and a Vcc node 101 by a logic circuit while the SONOS transistor 60 may be grounded.

In doing so, both the recall and pass transistors 80 and 70 may be turned on by the high-state voltage. And, the left SONOS transistor (e.g., in erase mode) 60 and a right SOOS transistor (e.g., in program mode) 61 may selectively apply the voltage applied to the Vcc node 101 according to their turn-on or turn-off states. Hence, left and right sides of the SRAM latch 50 may be in high and low states according to the operations of the SONOS transistors 60 and 61, respectively. As a result, the logic circuit may be used to read the information stored in the SONOS transistors 60 and 61.

When both the recall and pass transistors 80 and 70 are in the turn-on state, the left SONOS transistor (e.g., in erase mode) 60 may be turned on and the right SONOS transistor (e.g., in program mode) 61 may be turned off.

According to the operations of the SONOS transistors 60 and 61, the left and right sides of the SRAM latch 50 may be in high and low states, respectively. Hence, the logic circuit may be used to read the information stored in the SONOS transistors 60 and 61.

Under the above bias condition, unless a separate management is performed thereon, the depletion area 72 of the pass electrode 75 may merge with the depletion area 82 of the recall electrode 85 along the counter-doped channel area of the SONOS electrode 62.

Yet, in the configuration of the present invention, the impurity diffusion region 81 of the recall electrode 85 and the impurity diffusion region 71 of the pass electrode 75 extend toward the channel area CA of the SONOS electrode 62 using the extension channels 83 and 73, respectively. And, the extension channels 83 and 73 may be formed very thin. Hence, the depletion areas 82 and 72 under the recall and pas electrodes 85 and 75 can be formed thin. Hence, even if the channel area CA is counter-doped, the depletions areas 82 and 72 under the recall and pass electrodes 85 and 75 rarely merge with each other.

Moreover, since the depletion area over-diffusion cut-off inducing layers 91 and 92 are inserted in one interface between the SONOS and pass electrode 75 and the other interface between the SONOS and recall electrode 85 to cut off over-extension of the depletion areas 72 and 82 attributed to the extension channels 73 and 83, respectively, the depletions areas 82 and 72 under the recall and pass electrodes 85 and 75 are limited in their unnecessary extensions. Hence, the unnecessary contact between the depletion areas 72 and 82 can be cut off.

As discussed above, the unnecessary contact between the depletion areas 72 and 82 of the recall and pass electrodes 75 and 85 may be cut off so that the channel area CA can be held under control by the SONOS electrode 62. In such a case, the current flow from the Vcc node 101 to a Vs node 102 can be selectively controlled by the SONOS electrode 62. As a result, the final nvSRAM can function normally.

Moreover, since the recall and pass electrodes 85 and 75 are closely provided to both of the lateral sides of the SONOS electrode 62, an overall side of the semiconductor substrate 1 can be considerably reduced for device implementation.

Accordingly, in the present invention, a recall electrode and a pass electrode may be attached to both sides of a SONOS electrode, respectively to enable each channel area of the recall and pass electrodes play a role as an impurity diffusion region. And, depletion area over-diffusion cut-off inducing layers are inserted in one interface between the SONOS and recall electrodes and the other interface between the SONO and pass electrodes, respectively.

Therefore, a recall electrode depletion area can avoid merging with a pass electrode depletion area despite a counter-doped channel area of the SONOS electrode to normally sustain a channel area control of the SONOS electrode.

Moreover, by the present invention, an unnecessary contact between a recall electrode depletion area and a pass electrode depletion area is cut off to sustain a control of a channel area of a SONOS electrode and a current flow from a Vcc node to a Vs node can be selectively controlled, and by which an nvSRAM is normally operable.

It will be apparent to those skilled in the art that various modifications and variations can be made in the present invention. Thus, it is intended that the present invention covers the modifications and variations of this invention provided they come within the scope of the appended claims and their equivalents.

This application contains subject related to Korean Patent Application No. P2003-0101715, filed in the KIPO on Dec. 31, 2003, the entire contents of which is hereby incorporated by reference.

What is claimed is:

1. A non-volatile memory comprising:
   a semiconductor substrate;
   a SONOS electrode on the semiconductor substrate, the SONOS electrode having a channel area defined underneath;
   a pass electrode configured to face one lateral side of the SONOS electrode;
   a recall electrode configured to face another lateral side of the SONOS electrode;
   a pair of doped regions in the semiconductor substrate, the pair of doped regions being formed where the SONOS, pass, and recall electrodes are not formed; and
   a pair of extension channels in the semiconductor substrate under the pass and recall electrodes, the pair of extension channels being configured to cause the pair of the doped regions to extend toward the channel area.

2. The non-volatile memory device of claim 1, further comprising:
   a first layer provided between the SONOS electrode and the pass electrode; and a second layer provided between the SONOS electrode and the recall electrode.

3. The non-volatile memory device of claim 2, wherein a thickness of the first layer is between about 50 Å and about 500 Å and a thickness of the second layer is between about 50 Å and about 500 Å.

4. The non-volatile memory device of claim 2, wherein the first and second layers include an insulator.

5. A non-volatile memory comprising:
a semiconductor substrate;
a SONOS electrode on the semiconductor substrate, the SONOS electrode having a channel area defined underneath;
a first layer in contact with a side of the SONOS electrode;
a second layer in contact with another side of the SONOS electrode;
a pass electrode in contact with the first layer;
a recall electrode in contact with the second layer;
a pair of doped regions in the semiconductor substrate, the pair of doped regions being formed where the SONOS, pass, and recall electrodes are not formed; and
a pair of extension channels in the semiconductor substrate under the pass and recall electrodes, the pair of extension channels being extended from the doped regions toward the channel area.

6. The non-volatile memory device of claim 5, wherein a thickness of the first layer is between about 50 Å and about 500 Å and a thickness of the second layer is between about 50 Å and about 500 Å.

7. The non-volatile memory device of claim 5, wherein the first and second layers include at least one insulator.

* * * * *